United States Patent [19]

Vranken et al.

[11] Patent Number: 4,780,190

[45] Date of Patent: Oct. 25, 1988

[54] SPUTTERING CATHODE

[75] Inventors: Jean-Paul Vranken, Jemeppe-sur-Sambre; Roland Devigne, Sambreville, both of Belgium

[73] Assignee: Glaceries De Saint-Roch, Sambreville, Belgium

[21] Appl. No.: 33,991

[22] Filed: Apr. 2, 1987

[30] Foreign Application Priority Data

Apr. 3, 1986 [FR] France .............................. 86 04789

[51] Int. Cl.⁴ ............................................. C23C 14/34
[52] U.S. Cl. ................................ 204/298; 204/192.12
[58] Field of Search ................. 204/192.1, 192.12, 298

[56] References Cited

U.S. PATENT DOCUMENTS

| 3,956,093 | 5/1976 | McLeod | 204/298 X |
|---|---|---|---|
| 4,175,030 | 11/1979 | Love | 204/298 |
| 4,179,351 | 12/1979 | Hawton, Jr. et al. | 204/298 |
| 4,194,962 | 3/1980 | Chambers et al. | 204/298 |
| 4,200,510 | 4/1980 | O'Connell et al. | 204/298 X |
| 4,221,652 | 9/1980 | Kuriyama | 204/298 |
| 4,356,073 | 10/1982 | McKelvey | 204/298 |
| 4,415,427 | 11/1983 | Hidler et al. | 204/298 |
| 4,443,318 | 4/1984 | McKelvey | 204/298 |
| 4,468,313 | 8/1984 | Okumura et al. | 204/298 |
| 4,517,070 | 5/1985 | Kisner | 204/298 |
| 4,564,435 | 1/1986 | Wickersham | 204/298 |

FOREIGN PATENT DOCUMENTS 14819 9/1980 European Pat. Off. .
82/02725 8/1982 PCT Int'l Appl. .

Primary Examiner—John F. Niebling
Assistant Examiner—Nam X. Nguyen
Attorney, Agent, or Firm—Kenyon & Kenyon

[57] ABSTRACT

The invention relates to a cathode (1) intended for spraying thin layers of materials onto one or more substrates using the cathodic sputtering method.

It consists of a structure (V-shaped) comprising an electrical supply, cooling members and two sputtering planes (6, 7) in which there are arranged side by side at least two strips of target material joined at their ends forming a single continuous target material track extending between and positioned in at least two separate planes, the track being confined within a single magnetic circuit, which also extends between and is positioned in the at least two separate planes, with the result that it is possible to treat simultaneously two substrates (44) arranged on their supports (43) on each side of the cathode (1).

The cathode (1) according to the invention is particularly recommended for sputtering substrates of large size, such as glass.

10 Claims, 3 Drawing Sheets

U.S. Patent   Oct. 25, 1988   Sheet 1 of 3   4,780,190
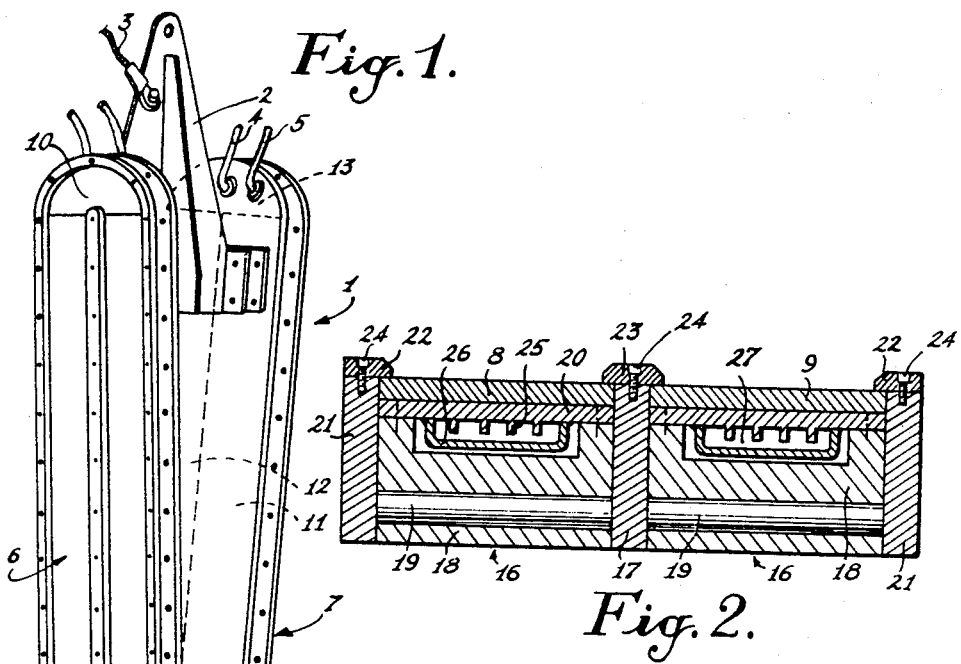
Fig. 1.
Fig. 2.
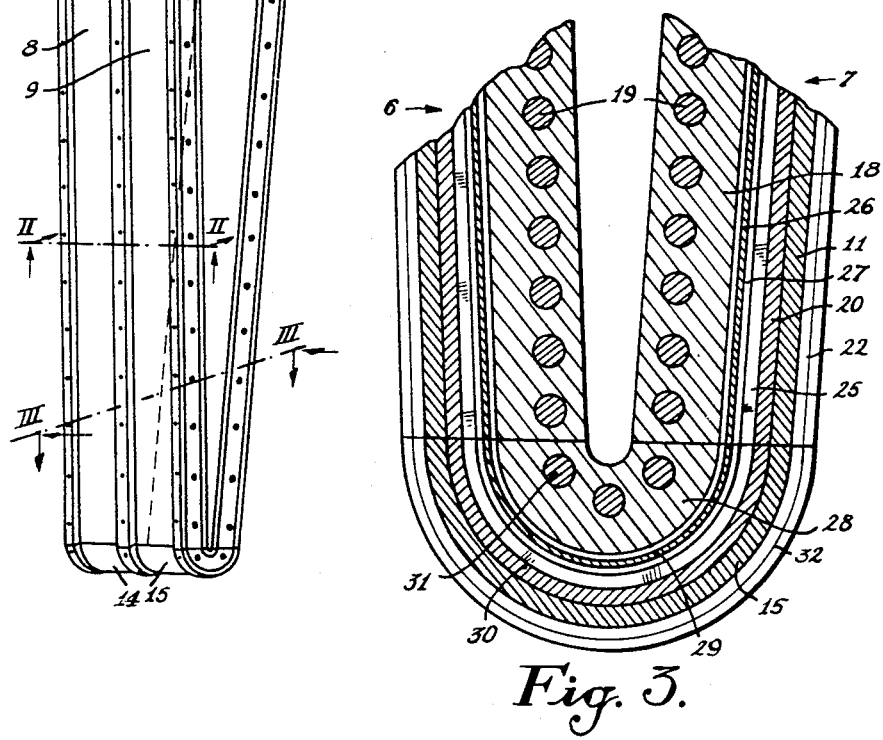
Fig. 3.

SPUTTERING CATHODE

BACKGROUND OF THE INVENTION (1) Field of the Invention

The present invention relates to a cathodic sputtering device designed especially for coating articles of large size such as, for example, plates of glass.

Cathodic sputtering is a now well-proven technique for applying thin and uniform layers of a coating material to certain substrates. In general, cathodic sputtering is performed by means of a cathode connected to a source of electricity, the cathode being placed in an enclosure in a rarified atmosphere, in the presence of a gas (for example argon) whose nature varies depending on the required coating. A target made of the material to be sprayed and fastened to the cathode is bombarded with high-energy ions so that the particles of the material of which the target is made are torn away from the latter. The substrate to be coated is placed on the path of these particles and on it there forms a fine layer of the target material or of a chemical compound of the latter formed with the surrounding gas.

The possibility of confining the ions in the vicinity of the target by means of a magnetic field has led to considerable progress in this method by substantially increasing the rate of sputtering.

(2) Description of the prior art

A type of cathode is described in U.S. Pat. No. 3,956,093. This describes a plane target in which the magnetic devices are arranged so as to produce a confinement zone in the shape of an oval track.

A cathode of this type permits only singlesided sputtering. If the invention is to sputter both sides at the same time, then two cathodes must be placed with their backs close together, and this can involve the use of two separate supplies and make the process of controlling the deposit tricky.

Another sputtering cathode, for coating substrates of large size, is described in U.S. Pat. No. 4,971,196. In this cathode, two parallel target faces are connected by bridging faces in order to provide the continuity of the magnetic confinement belt. This cathode permits two opposing sides to be sprayed simultaneously, but it involves a relatively low speed of sputtering. To increase the rate of growth of the deposit, a number of cathodes of this type can be placed side by side in the same enclosure. Here too, separate supplied must be employed to obtain a homogeneous and reproductible deposit, and this greatly complicates the control process of the system.

SUMMARY OF THE INVENTION

The purpose of the invention is to obtain a sputtering cathode permitting spraying onto substrates of large size, in different planes with a high rate of sputtering, with the targets forming only a single continuous track, which simplifies the electrical supply and the control process and which improves the uniformity of the deposit.

In fact, with its rate of sputtering, a single cathode according to the invention may be substituted for several conventional cathodes, with the advantage that there is then only a single supply and a single control system. An additional advantage is the avoidance of the risk of interaction linked with the presence of different cathodes situated in the same enclosure.

Lastly, it has been shown by experiment that the uniformity of the deposits produced with a cathode according to the invention, with a single supply, is markedly superior to that which can be obtained with a series of conventional cathodes which, moreover, demand separate supplies and controls.

The subject of the invention is a sputtering cathode comprising :

a supporting structure made of an electrically conductive material on which are secured several strips of material to be sputtered which are situated in at least two separate planes, means permitting the supporting structure to be connected to a source of electric current and magnetic means situated in the supporting structure, which are arranged so as to direct a magnetic field into the vicinity of the surface of the strips of material to be sputtered, and over the entire length of the latter. In each plane, at least two strips of material to be sputtered are arranged side by side and are connected together in series, forming a single open track, leaving only two free ends remaining. The tracks thus formed in each plane are connected together by means of the remaining corresponding free ends in order to form a single continuous track which is closed onto itself. Magnetic means are provided in the connecting zones between the strips, so that a continuous magnetic confinement zone closed onto itself is superposed on the continuous track of the material to be sputtered.

In an embodiment of the invention, the sputtering cathode comprises strips of material to be sputtered which are situated in two parallel planes, so that two substrates situated in two parallel planes on each side of the cathode may be coated simultaneously.

In a preferred embodiment of the invention, the strips of material to be sputtered are situated in two intersecting planes, so that two substrates situated on each side of the cathode, in parallel to the sputtering faces, can be coated simultaneously.

A preferred form of the invention comprises two strips of material to be sputtered which are arranged side by side in each plane of sputtering of the cathode.

Another embodiment comprises more than two strips of material to be sputtered which are arranged side by side in each plane.

In a possible embodiment of the invention, the target consists of strips of material to be sputtered which are of different kinds.

In a particular embodiment of the cathode according to the invention, each sputtering plane comprises one or more strips of material to be sputtered, which consist of a material different from that of the other strips.

In a possible embodiment, the strips of material forming the target are themselves made up of a number of different materials.

In an advantageous embodiment of the invention, the space between the inner faces of the cathode is occupied by a nonmagnetic (conductive or insulating) material, such aluminium, in order to prevent the sputtering of the rear face of the device.

Advantageously, the cathode according to he invention is equipped with a cooling system consisting of a closed-section conduit placed close to the target element. This design avoids a risk of leakage through the seals between the cooling system and the vacuum enclosure.

BRIEF DESCRIPTION OF THE SEVERAL VIEWS OF THE DRAWINGS

Other particular features and advantages of the invention will become apparent from the detailed description of a preferred embodiment, which is given below, by way of example without implying any limitation, with reference to the attached drawings, in which:

FIG. 1 is a perspective view of a type of sputtering cathode according to the invention;

FIG. 2 is a cross-sectional view of one of the arms of the cathode of FIG. 1, along the line II—II of FIG. 1;

FIG. 3 is a view in lengthwise section along the line II—II of FIG. 1;

DETAILED DESCRIPTION OF THE DRAWINGS

Figure 4:
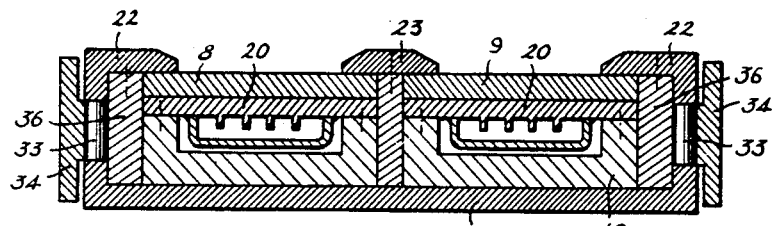
FIG. 4 is an alternative embodiment of FIG. 2.

A sputtering cathode according to the invention is shown in perspective in FIG. 1. Seen from the side, the cathode 1 has a V-shaped structure overall; it is equipped with a mounting lug 2 which enables it to be suspended in its vacuum sputtering enclosure. The cathode is made of an electrically conductive material and has a means of connection 3 enabling it to be connected to an electrical supply and means of connection 4 and 5 enabling it to be connected to a cooling circuit. It has two outer faces 6 and 7 extending along two intersecting planes, each face being equipped with devices permitting strips of material to be sputtered to be easily attached. Two lengthwise strips 8 and 9 are attached to the face 6, and are connected together by one of their ends by means of a strip 10 in the form of an arc of a circle. Similarly two lengthwise strips 11 and 12 are attached to the face 7 and are connected together by one of their ends by means of a strip 14 in the form of an arc of a circle. Two strips 14 and 15 bent into a U shape connect together the strips 8 and 12 and the strips 9 and 11, respectively, so that the set of strips forms a continuous track, closed onto itself, extending between and positioned along the two separate outer faces of the cathode. The cathode comprises magnetic devices and a cooling system which will be described with reference to FIGS. 2 and 3.

FIG. 2 is a view in cross-section into one of the arms of the cathode of FIG. 1, along the line II—II. Each arm comprises two similar parts 16 which are separated by a plate 17. Each part 16 comprises a body 18 to which are attached the magnetic devices 19, a target support 20, a strip 8 or 9 of material to be sputtered, or target, an external plate 21, and target clamping members 22 and 23 which are fixed to assembly by means of screws 24.

The body 18 is made of a nonmagnetic electrically conductive material, for example aluminium, and is connected to the electrical supply. The target support 20 is attached to the body 18 by means of screws and is made of a nonmagnetic conductive material, for example stainless steel or aluminium. It is equipped with cooling fins 25 and with a welded sheet 26 of stainless steel or of aluminium forming a closed space 27 coupled to the connections 4 and 5, in which a cooling agent, for example water, circulates. This cooling agent is intended to remove the heat energy produced by the ion bombardment process. Plates 17 and 21 and the target clamping members 22 and 23 are made of a magnetic material such as mild steel.

The cathodic spraying target 8, 9 matches closely the shape of the target support 20, to which it is attached by means of clamping members and of magnetic confinement 22 and 23, so as to ensure good electrical contact with the target support 20 and the body 18, with the result that the target is at the voltage of the negative terminal of the electrical supply.

The magnetic devices 19 which in this case consist of cylindrical permanent magnets, have their ends supported by the plates 17 and 21, all the magnets in a body 16 having their poles aligned in one direction, all the magnets in the adjacent body 16 having their poles aligned 17 is in contact with the pole of the same sign of all the magnets, the plates 21 being in contact with the poles of the opposite sign. Given the nature of the materials employed for the plates 17 and 21, as well as for the clamping members 22 and 23 and for the target, the lines of magnetic flux close between the clamping members 22 and 23, in the vicinity of the target, and this produces a magnetic zone confining the positive ions formed at the target in the plasma in the form of a tunnel with the shape of the arc of a circle.

FIG. 3 shows a view in lengthwise section of the cathode according to the invention, showing the connection zone between the two faces 6 and 7. Each member of the face 6, namely the body 18, the target support 20 and the target 8, is connected to the corresponding member of the face 7, so as to ensure electrical continuity between the corresponding members of both faces. The bodies 18 are connected together by means of a U-shaped body 18. The welded metal sheets 26 are connected together by a metal sheet 29 connecting together the closed spaces 27 in which the cooling agent circulates. The target supports 20 are connected together by a U-shaped member 30, and the targets 9 and 11 are connected together by a U-shaped member 15.

The body 28, made of a material similar to that of the bodies 18, comprises magnetic devices 31, which in this case consist of cylindrical permanent magnets, so that the lines of magnetic flux close in the vicinity of the members 14 and 15, connecting together the zones of magnetic confinement of the faces 6 and 7, to form a single magnetic continuous confinement zone which extends between and is positioned in the two separate planes where it is superposed and confines the continuous track of the strips of material to be sputtered.

The U-shaped members 30 are made of a material similar to that of the target supports 20 and, like the latter, are provided with cooling fins.

The target members 14 and 15, made of the same material as the target members 8, 9, 11, 12, are attached to the target support 30 by means of U-shaped clamping members 32, so as to ensure good electrical contact with the target support 30 and the body 28, with the result that the target members 14 and 15 are at the voltage of the negative terminal of the electrical supply.

It is obvious that sputtering also takes place at the target members 14 and 15. A cathode according to the invention thus makes it possible to homogeneously metalize curved substrates which travel in front of target parts whose shape is curved and matches that of the substrates to be metalized.

FIG. 4 is an alternative embodiment of FIG. 2, in which the magnetic devices, in this case consisting of cylindrical permanent magnets 33, are fastened in a plane at right angles to the targets 5, 6, by means of plates 34 made of a nonmagnetic conductive material, for example aluminium. All the magnets have their poles aligned in the same direction, the clamping members 22 being in contact with all the poles of the same sign, while the plate 35 is in contact with all the poles of the opposite sign. The plate 35 is made of a magnetic material such as mild steel. This is also the case for the clamping members 22 and 23. The bodies 18, the members 36 and the target supports 20, on the other hand, are made of nonmagnetic conductive materials, so that the lines of magnetic flux close between the clamping members 22 and 23, in the vicinity of the target, similarly to FIG. 2.

Figure 5:
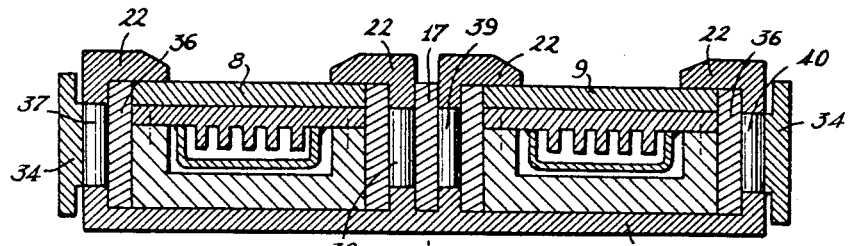
FIG. 5 is another alternative embodiment of FIG. 2.

FIG. 5 shows another alternative embodiment of FIG. 2, in which magnetic devices 37, 38, 39, 40, consisting of cylindrical permanent magnets, are arranged at right angles to the plane of the targets 8 and 9, as in FIG. 4, but on either side of each target strip.

All the magnets 37 and 40 have their poles aligned in the same direction, while all the magnets 38 and 39 have their poles aligned in the opposite direction, in order to produce through the plate 41 and the clamping members 22 a magnetic field which is closed in the vicinity of the target, similarly to FIG. 2.

Figure 6:
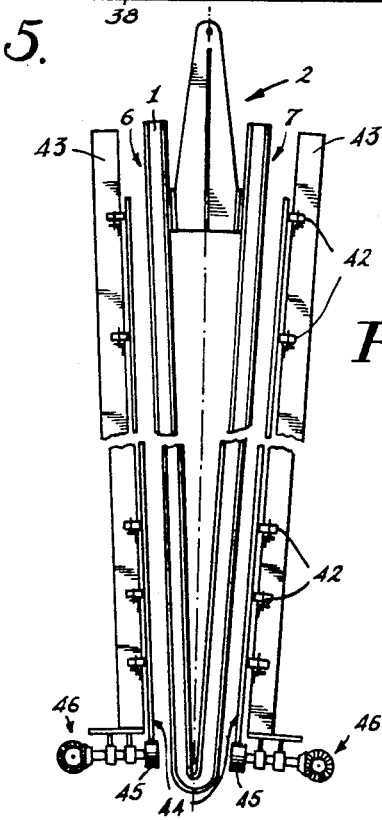
FIG. 6 is a diagrammatic transverse view of a part of a system for coating using cathodic spraying according to the invention with a device for driving the substrates.

FIG. 6 shows the cathode of FIG. 1 with the substrates and the devices permitting the substrates to be moved. The cathode 1 is fixed vertically so that its two sputtering faces 6 and 7 are inclined at the same angle on each side of a vertical plane. On each side of the cathode, rollers 42 which are integrally fastened to supports 43 parallel to the faces 6 and 7 form two bearing faces on which there are arranged the substrates 44, for example large plates of glass. The lower ridge of the substrates rests on the rollers 45. A control device 46, consisting of a series of bevel gears, turns the rollers 45 so that the substrates travel in a translatory motion in two planes parallel to the sputtering faces 6 and 7. The length of the sputtering faces is such that they overlap the upper and lower edges of the substrates in order to ensure uniform coating of the substrates over their entire height, including the bottom and top extremities.

An advantage of the cathode according to FIG. 6 lies in the slope of the faces 6 and 7 in relation to the vertical; the substrates may be simply placed on the driving rollers 45 while resting on the free rollers 42; no means for fastening the substrates is thus necessary, and this enables the latter to be coated over their entire surface, without any part being masked by fasteners.

Figure 7:
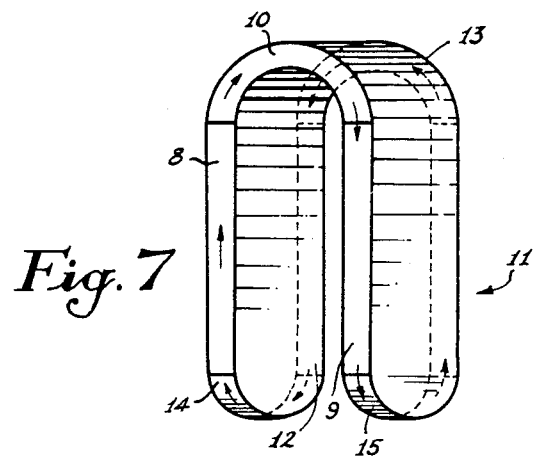
FIG. 7 is a diagrammatic perspective view of an alternative embodiment of a cathode according to the invention.

FIG. 7 shows diagrammatically a cathode according to the invention, whose two sputtering faces are situated in two parallel planes, each consisting of two target strips connected together by one of their ends, the ends which remain free in each plane being connected together in order to form a single continuous, closed track.

Figure 8:
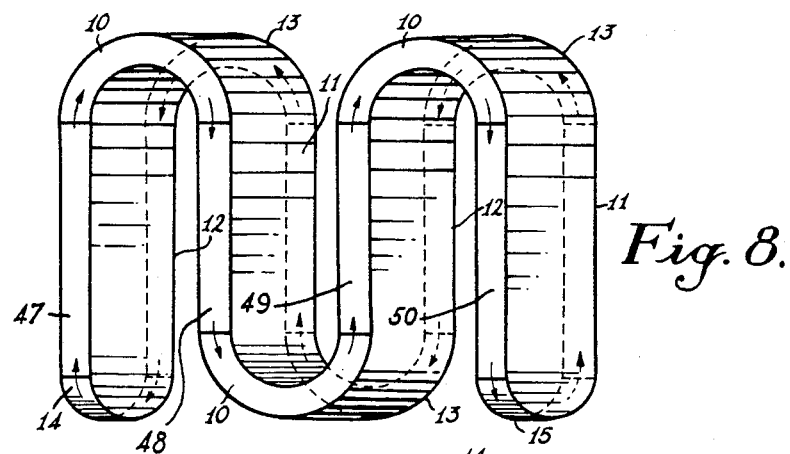
FIGS. 8 and 9 are diagrammatic perspective views of two other alternative embodiments of a cathode according to the invention.

FIG. 8 shows diagrammatically a different embodiment. The cathode comprises two sputtering faces situated in two parallel planes, each of which consists in this case of four adjoining target strips connected together by their ends in order to form in each plane a single track which is open at both its ends, the tracks thus formed in the two sputtering planes being connected together by their corresponding free ends in order to form a single continuous, closed track.

The cathode such as is illustrated diagrammatically in FIG. 8 clearly shows the possibility offered by the invention of producing two sputtering faces capable of being extended in both directions, by the addition of strips of material to be sputtered, while retaining a single continuous track relying on a single electrical supply circuit.

Figure 9:
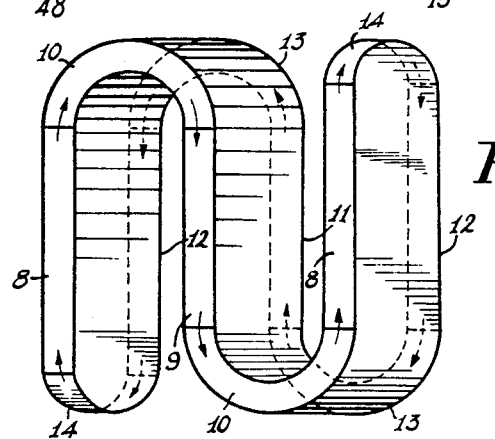

FIG. 9 shows another possible embodiment of a cathode according to the invention and provided with an odd number of target-strips in each plane.

It will be noted that the target may consist of successive strips of different kinds. Because of the configuration of the cathode according to the invention, a substrate can be made to pass in front of target lengths sputtering different materials and can thus be coated, in a single pass, with successive and different layers of materials, this being done with a single supply and hence a single control system.

Using the same single cathode, it is possible to deposit as many different layers as there are strips arranged on each face. Thus, the cathode described in FIG. 8 makes it possible to sputter, in a single pass, four layers of materials onto the same single substrate; copper, for example, by passing in front of the members 47 and 48 of the target, followed by silver, sprayed from the target member 49 and, lastly, gold from the member 50.

Obviously, the invention is not limited in any way to the embodiments shown and described above, it being possible for many alternate forms and modifications to be introduced therein without departing from its scope.

What is claimed is:

1. A sputtering cathode comprising: a structure made of an electrically conductive material on which are fastened a plurality of strips of material to be sputtered, such that at least two strips of material to be sputtered are positioned in each of at least two different planes, means enabling the cathode to be connected to a source of electric current, and magnetic means arranged so that a magnetic field is generated within each plane in which the strips of material to be sputtered are positioned such that the entire surface of the strips of material to be sputtered is confined within the magnetic field, each of said strips having a pair of opposite ends, each of said strips positioned in each plane being arranged side by side and at least two ends of the strips positioned in one of the planes being connected to two ends of the strips positioned in the other of the planes and the remainder of the ends of the strips positioned in each respective plane being connected to one another, whereby the strips of material to be sputtered are connected together in series at their ends in order to form a single continuous, closed track, extending between and positioned in at least two separate planes, and the magnetic means further being arranged in the regions where the at least two ends of the strips positioned in one of the planes is positioned connecting said strips to the strips positioned in the other of said planes, whereby a single continuous magnetic confinement field is provided extending between and positioned in at least two separate planes and in which is confined the continuous track of material to be sputtered.

2. The sputtering cathode as claimed in claim 1, wherein the planes in which the strips of material to be sputtered are parallel planes.

3. The sputtering cathode as claimed in claim 1, wherein the planes in which the strips of material to be sputtered are intersecting planes.

4. The sputtering cathode as claimed in claim 1, wherein two strips of material to be sputtered are arranged in each plane.

5. The sputtering cathode as claimed in claim 1, wherein more than two strips of material to be sputtered are arranged in each plane.

6. The sputtering cathode as claimed in claim 1, wherein at least one of the strips of material to be sputtered consists of a material different from that of the remaining strips.

7. The sputtering cathode as claimed in claim 6, wherein each plane includes at least one of the strips of material to be sputtered consisting of a material being different from that of the remaining strips.

8. The sputtering cathode as claimed in claim 6, wherein at least one of the strips of material to be sputtered consists of two or more different materials.

9. The sputtering cathode as claimed in claim 1, further including a cooling system consisting of a closed-section conduit adjoining the strips.

10. The sputtering cathode as claimed in claim 9, wherein the cooling system has a surface for exchange with the cooling fluid which is larger than the surface of the strips itself.

* * * * *

UNITED STATES PATENT AND TRADEMARK OFFICE
CERTIFICATE OF CORRECTION

PATENT NO. : 4,780,190

DATED : October 25, 1988

INVENTOR(S) : JEAN-PAUL VRANKEN, et al

It is certified that error appears in the above-identified patent and that said Letters Patent is hereby corrected as shown below:

```
Column 1, line 49 change "supplied" to -supplies-
Column 1, line 50 change "reproductible" to -reproducible-
Column 2, line 61 change "such" to -such as-
Column 2, line 63 change "he" to -the-
Column 3, line 46 change "14" to -13-
Column 4, line 22 change "aligned 17" to -aligned in the opposite
     direction so that plate 17-
Column 4, line 40 change "18" to -28-
Column 4, line 54 change "superposed" to -superposed on-
Column 5, line 7 change "5, 6" to -6, 7-
```

Signed and Sealed this

Seventh Day of November, 1989

Attest:

JEFFREY M. SAMUELS

Attesting Officer     Acting Commissioner of Patents and Trademarks